United States Patent [19]
Gretz

[11] Patent Number: 6,114,630
[45] Date of Patent: Sep. 5, 2000

[54] SNAP IN CABLE CONNECTOR

[75] Inventor: Thomas J. Gretz, Clarks Summit, Pa.

[73] Assignee: Arlington Industries, Inc., Scranton, Pa.

[21] Appl. No.: 09/181,890

[22] Filed: Oct. 29, 1998

[51] Int. Cl.[7] .................................................. H02G 3/18
[52] U.S. Cl. ........................................ 174/65 R; 174/51
[58] Field of Search ...................... 174/65 R, 51

[56] References Cited

U.S. PATENT DOCUMENTS

| | | | |
|---|---|---|---|
| 4,012,578 | 3/1977 | Moran et al. | 174/51 |
| 4,711,472 | 12/1987 | Schnell | 174/65 R X |
| 4,880,387 | 11/1989 | Strikeleather et al. | 174/65 R X |
| 4,990,721 | 2/1991 | Sheehan | 174/65 R |
| 5,171,164 | 12/1992 | O'Neil et al. | 174/65 R X |
| 5,266,050 | 11/1993 | O'Neil et al. | 174/65 R X |
| 5,373,106 | 12/1994 | O'Neil et al. | 174/65 R |

*Primary Examiner*—Dean A. Reichard

[57] ABSTRACT

A one-piece tubular snap-in electrical connector for connecting electrical cables to junction boxes. The connector is formed from an elastic material and includes tangs projecting outwardly from the tubular body which function to lock the forward end in a junction box and cause the connector to be grounded to the junction box. Inward projecting tangs on the opposite end of the connector are spaced to anchor successive helixes on a helically-wound cable. The ends of the inward projecting tangs force an inserted cable to be channeled against one inner wall of the tubular body and resist rearward movement of the cable once it is thus inserted.

11 Claims, 4 Drawing Sheets

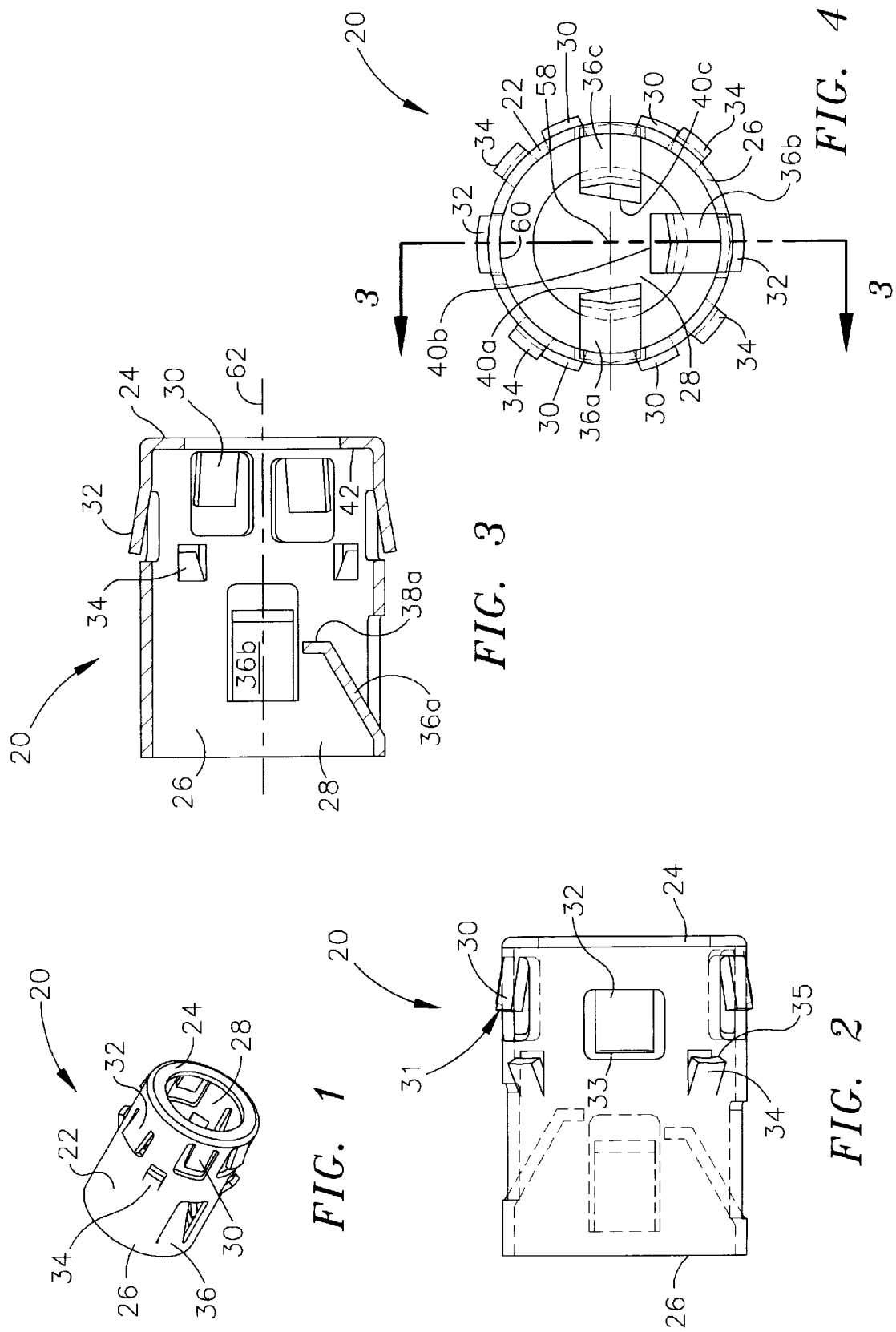

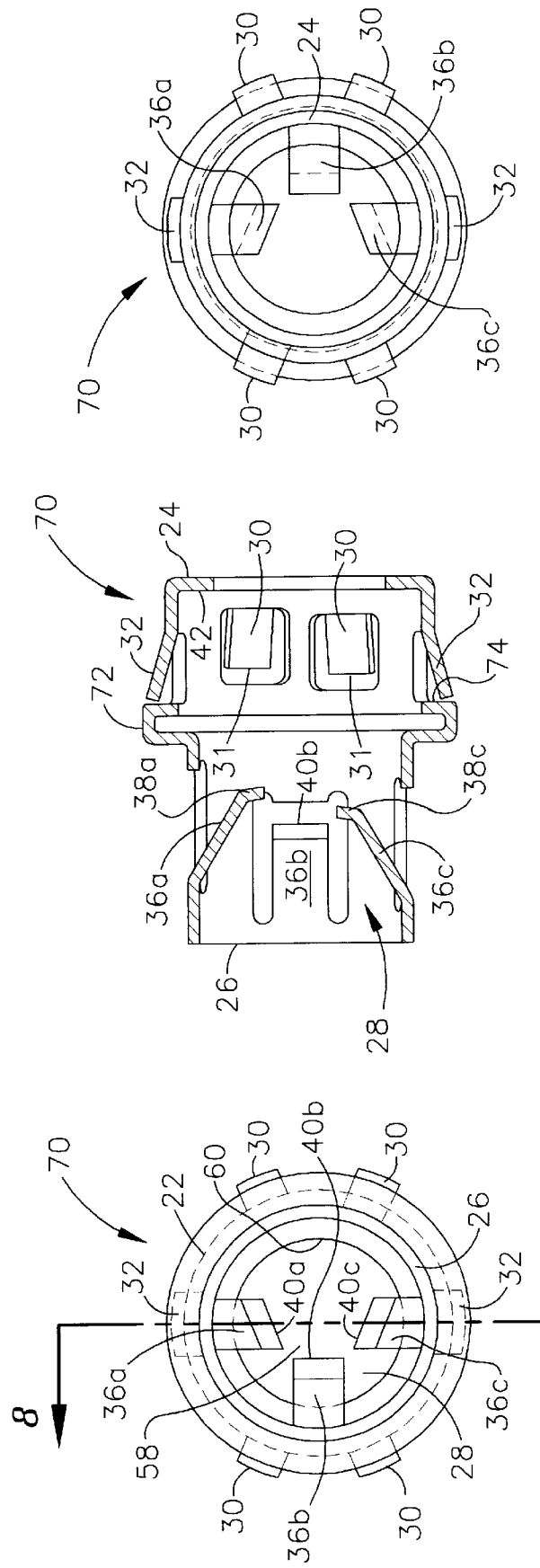

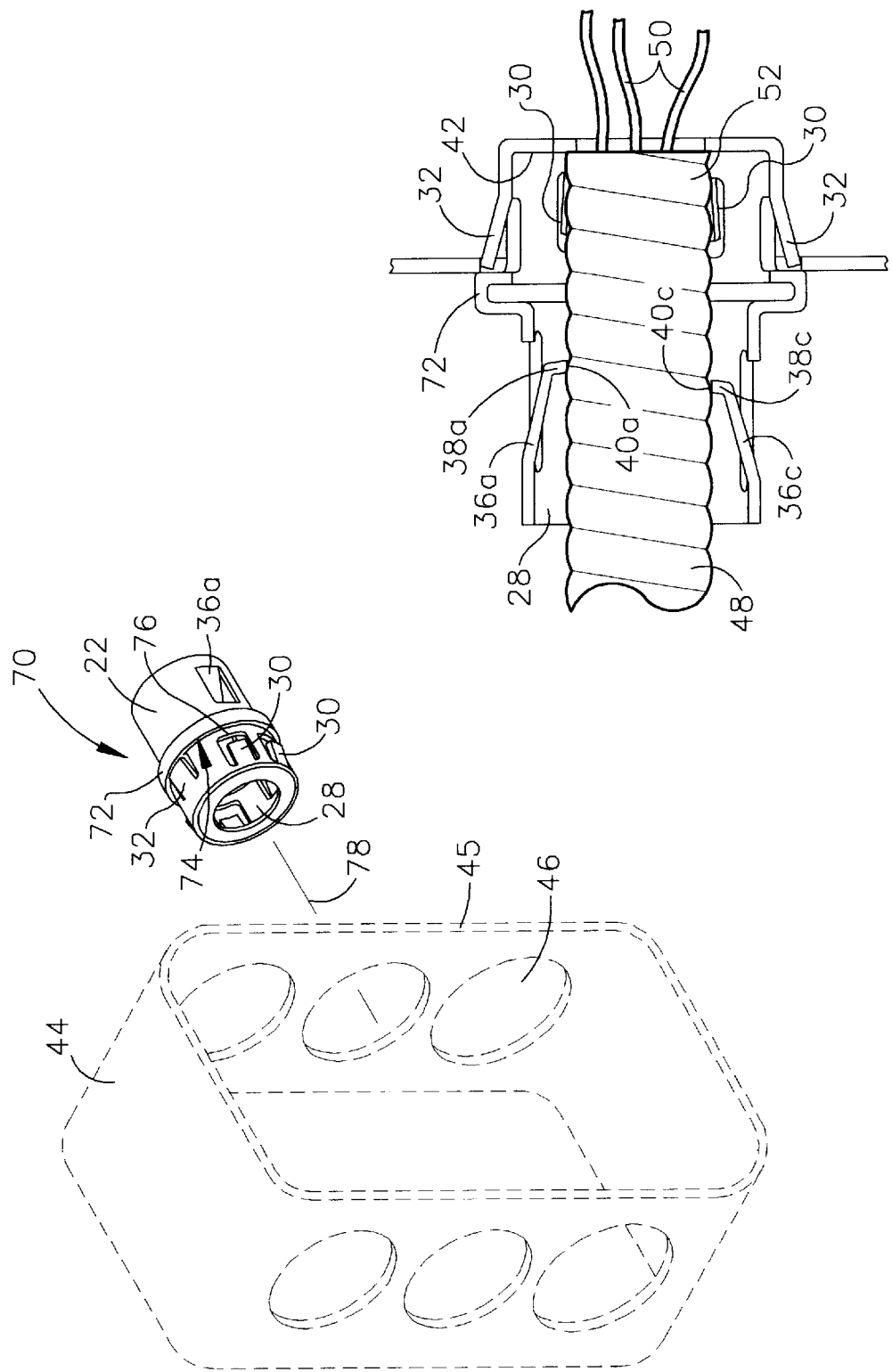

SNAP IN CABLE CONNECTOR

FIELD OF THE INVENTION

This invention relates to cable terminations and more particularly to locking cable terminations which snap into place and require no screws or twisting for locking.

BACKGROUND OF THE INVENTION

An extensive number of various types of cable connectors have been designed since the initial use of electricity prior to the turn of the century. Many types are still in use in some form. The most common initial design that is in use today is a type that was first patented in the mid-twenties. This type includes a screw that is tightened once the cable or electrical wire is in place. The electrical cable is fed into a hole or slot in a junction box through an oversized fitting that has provision for receiving a screw. In the early design the screw was configured to press directly against the electrical cable. This presented problems with the screw penetrating the insulation covering on the wire.

Presently, one screw type securement is where the screw tightens a clamp that presses against the wire covering. The screw is normally fitted into the wall of a junction box and pulls the clamp closer to the wall of a junction box and pulls the clamp closer to the wall as the screw is tightened. These clamps are designed so that even at their tightest when the screw pulls a portion of the clamp against the wall, there is a space between the portion of the clamp pressing against the wire and the wall of the junction box.

In more recent years, there have been several patents that involve snap type fittings. The snap type fittings typically are constructed of several pieces including a barrel shaped fitting with separate sleeves or collars formed of spring steel. The spring steel collars typically have tangs protruding from their outer circumference.

As the snap type fittings are constructed of several pieces, the complexity of the fitting is increased. A need exists for a simple, one-piece snap-in electrical connector.

SUMMARY OF THE INVENTION

The invention consists of one-piece snap-in electrical connector for connecting electrical cables to junction boxes. The connector is formed from an elastic material, such as spring steel or spring brass, and includes tangs projecting outwardly from the tubular body which function to lock the forward end in a junction box and cause the connector to be grounded to the junction box. Inward projecting tangs on the opposite end of the connector are spaced to anchor successive helixes on a helically-wound cable. The ends of the inward projecting tangs force an inserted cable to be channeled against one inner wall of the tubular body and resist rearward movement of the cable once it is thus inserted.

OBJECTS AND ADVANTAGES

A principal object of the present invention is to provide an electrical connector of one-piece resilient material that enables a cable to be secured to a junction box by a simple snap in action and does not require the use of screws or similar mechanical fastening means.

A second object is to provide an electrical connector that is easy to use. Another object is to provide an electrical connector that forms an electrically grounded connection between the cable and the junction box when it is snapped thereto. A further object is provide an electrical connector that securely holds an inserted cable and prevents its withdrawal therefrom.

Other objects and advantages of the present invention will become apparent after reviewing the following description and the attached drawings.

DESCRIPTION OF THE DRAWINGS

FIG. 1 is a perspective view of the preferred embodiment of the one-piece snap-in electrical connector of the present invention.

FIG. 2 is a side view of the one-piece snap-in connector of FIG. 1.

FIG. 3 is a cross-sectional view of the one-piece snap-in connector taken along lines 3—3 of FIG. 4.

FIG. 4 is an end view of the one-piece snap-in connector as viewed from the trailing end or the left side of FIG. 2

FIG. 7 is an end view of a second embodiment of the one-piece snap-in electrical connector as viewed from the trailing end.

FIG. 8 is a cross-sectional view of the second embodiment of the one-piece snap-in electrical connector taken along lines 8—8 of FIG. 7.

FIG. 9 is an end view of the second embodiment of the one-piece snap-in electrical connector as viewed from the forward end, or as viewed from the right side of FIG. 8.

FIG. 10 is a perspective view of the second embodiment of the one-piece snap-in electrical connector in alignment with a junction box.

FIG. 11 is a partially cross-sectional view of the one-piece snap-in electrical connector with an electrical cable inserted therethrough.

DESCRIPTION OF THE INVENTION

Figure 6:
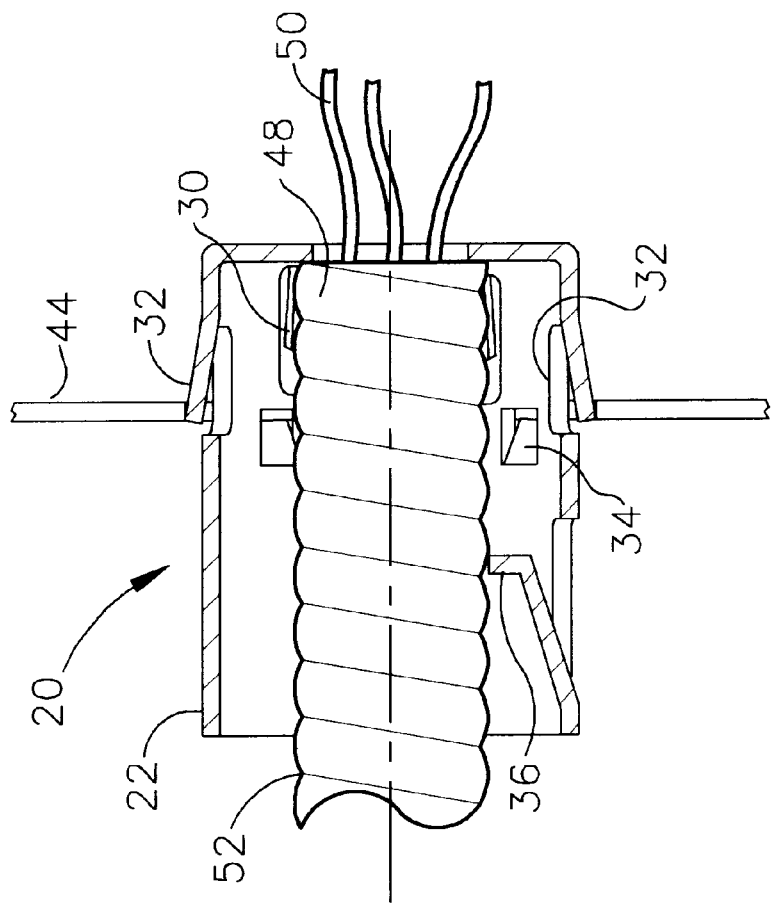
FIG. 6 is a partially cross-sectioned view of a preferred embodiment of the one-piece snap-in connector, a junction box, and a cable.

The first and preferred embodiment of the invention, as shown in a perspective view in FIG. 1, is a one-piece snap-in electrical connector 20. The tubular shaped body 22 is typically constructed of 0.036" thick spring steel. The snap-in connector 20 has a forward end 24, a trailing end 26, and a cylindrical channel 28 as shown in FIG. 1. A plurality of integral securement tangs 30, a plurality of grounding tangs 32, and a plurality of stop tangs 34 project outwardly from the forward end 24 of the tubular body 22.

As shown in FIG. 2, a side view of the preferred embodiment of the one-piece snap-in connector 20, the ends 31 of the seucrement tangs 30 are oriented toward the trailing end 26 of the tubular body 22. The grounding tangs 32 project outwardly from the tubular body 22 and are located longitudinally along the tubular body 92 between the securement tangs 30 and the stop tangs 34. The ends 33 of the grounding tangs 32 are oriented in FIG. 2 toward the trailing end 26 of the tubular body 22. The integral stop tangs 34 project outwardly from the forward end 24 of the tubular body 22 with their ends 35 oriented toward the forward end 24.

As shown in FIG. 4, an end view of the preferred embodiment of the one-piece snap-in connector as viewed from the trailing end or the left side of FIG. 2, a plurality of integral cable tangs 36a, 36b, 36c project inwardly from the trailing end 26 of the tubular body 22 with the ends 40 of the cable tangs 36 oriented toward the forward end 24 of the tubular body 22. The cable tangs 36a, 36b, 36c are positioned approximately 90° apart in essentially one-half of the tubular body 22. As depicted in FIG. 4, the edges 40a, 40b, 40c of the cable tangs 36a, 36b, 36c are cut at different angles to form a pyramid-shaped channel within the cylindrical channel 28 of tubular body 22. The pyramid-shaped channel enables an inserted cable to nest within the tubular body 22 and forces the cable (not shown) against the far wall 60 of the connector 20.

FIG. 3, a cross-sectional view of a preferred embodiment of the connector 20 taken along lines 3—3 of FIG. 4, shows a cross-section of cable tang 36b. Each cable tang has an angled tip, such as angled tip 38b shown for cable tang 36b. The angled tips 38a, 38b, 38c (38c not shown) aid in gripping the helical groove of a cable (not shown). The angled tip 38a, 38b, 38c is at approximately a 90° angle to the axis 62 through the cylindrical channel 28 of the tubular body 22.

As depicted in FIG. 3, the cable tangs 36a, 36b (38c not shown) are offset at varying distances from the trailing end 26 of the connector 20. The staggered distances enable each angled tip 38a 38b, 38c of each cable tang 36a, 36b, 36c to seat in a successive helix of a helically wound cable when it is inserted within the cylindrical channel 28 of the tubular body 22. The angled tips ensure that any inserted cable cannot easily be withdrawn from the connector. As further shown in FIG. 3, each securement tang 30 is equidistant from the forward end 24 of the tubular body 22, each stop tang 34 is equidistant from the forward end 24, and each grounding tang 32 is equidistant from the forward end 24, with the securement tangs 30 nearest the forward end 24, the stop tangs 34 farthest from the forward end 24, and the grounding tangs 32 at an intermediate distance between the securement and grounding tangs. The space between the securement tangs 30 and the stop tangs 34 forms a seat 56 that will bound the walls of a junction box when the connector is inserted therein.

Figure 5:
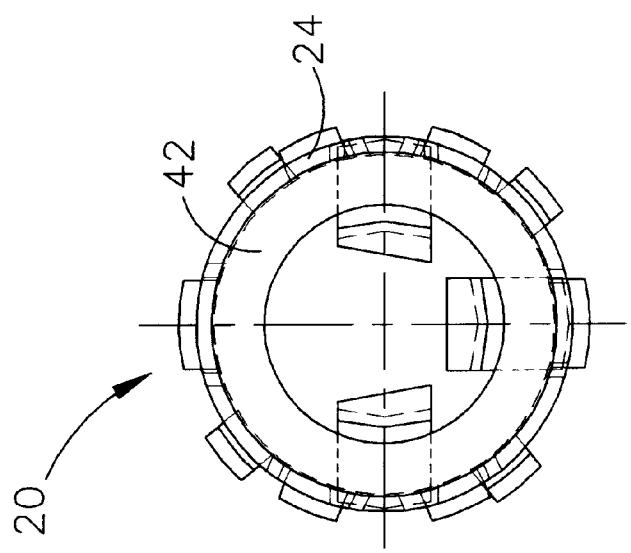
FIG. 5 is an end view of the one-piece snap-in connector as viewed from the forward end or the right side of FIG. 2.

FIG. 5 is an end view of a preferred embodiment of the one-piece snap-in connector as viewed from the forward end 24 or the right side of FIG. 2. The lip 42 at the forward end 24 of the snap-in connector 24 limits the travel of any cable that may be inserted (not shown) in the connector, and prevents it from going too far into the box.

FIG. 6 is a perspective view of the preferred embodiment of the one-piece snap-in connector 20, a junction box 44, and a cable 48. The cable 48 is a helically-wound cable having helical grooves 52 and includes wires 50. As shown in FIG. 6, each cable tang 36 engages and seats in a successive helical groove 52 on the cable 48 and thereby holds the cable 48 securely in place within the connector 20. The connector 20 is held within the junction box 44 by the securement tangs 30 and stop tangs 34. The grounding tangs 32 bear against the inner periphery of the knock-out 46 and provide grounding between the connector 20 and the junction box 44.

The connector is very simple and easy to apply as a result of its one piece construction. An installer would simply insert the end of a cable into the cylindrical channel 28 within the tubular body 22 from the trailing end 26. The cable 48 would advance until it entered the pyramid-shaped channel created by the cable tangs 36a, 36b, 36c. The pyramid-shaped channel would funnel the cable 48 against the far wall 60 of the cylindrical channel 28. The cable 48 would be inserted until it made contact with the lip 42 at the forward end 24. The action of the angled tips 38a, 38b, 38c of the cable tangs 36a, 36b, 36c would then hold the cable 48 fast within the connector 20. The forward end 24 of the connector 20 would then be inserted into a knock-out 46 in the wall of a junction box 44. As the forward end entered the knock-out 46, the securement tangs 30 would be depressed by the inner peripheral of the knock-out. As the forward end 24 is advance further, the grounding tangs 32 are also depressed by the inner periphery of the knockout 46. Once the wall of the unction box 44 cleared the ends 31 of the securement tangs 30, the elastic action of the spring steel would cause the securement tangs 30 to snap back to their relaxed state. Further advancement of the forward end 24 of the connector 20 into the junction box is limited by the stop tangs 34, whose edges face toward the junction box. The securement 30 and stop 34 tangs therefore define a seat 56 in which the junction box 44 rests. In its final position, with the junction box resting in the seat 56, the grounding tangs 32 remain stressed by the inner periphery of the knock-out 46 within the junction box 44 and therefore provide grounding between the connector 20 and the junction box 44. In its final state, the connector is secured to the junction box by the action of the securement and stop tangs and the cable is secured within the connector by the action of the cable tangs on the helically-wound cable.

For a standard junction box, the tubular body of the preferred embodiment of the connector would typically measure about 1.097" in length by 0.836" outer diameter. The inner diameter of the tubular body would typically measure 0.764". The outer diameter measured across the securement tangs and the grounding tangs is typically 0.912" and the outer diameter across the stop tangs is typically 0.941". The one-piece snap-in connector is typically constructed of 0.036" thick spring steel. The tubular body of the connector may be a cylinder, a split cylinder having a longitudinal welded seam, or a split ring having straight or dove-tailed edges.

The tubular connector of both embodiments is readily manufactured by being formed from a single piece of spring metal of a thickness approximating 0.036 inches in thickness.

The one-piece connector may have a plastic grommet inserted in the opening of forward end 24.

FIG. 7 is an end view of a second embodiment 70 of the one-piece snap-in electrical connector as viewed from the trailing end 26 of the connector 70. The second embodiment consists of a tubular body 32 with a cylindrical channel 28 through its interior. A plurality of cable tangs 36a, 36b, 36c having ends 40a, 40b, 40c extend inwardly from the tubular body 22 and into channel 28 and thereby form a pyramid-shaped channel within the connector 70. A cable (not shown) inserted within the connector 70 would be forced against the far wall 60 by the action of the flexible cable tangs 36a, 36b, 36c. A plurality of securement tangs 30 extend outwardly from the tubular body 22 of the connector 70 as do a plurality of grounding tangs 32.

FIG. 8 is a cross-sectional view of the second embodiment of the one-piece snap-in electrical connector taken along lines 8—8 of FIG. 7. The cylindrical channel 28 extends through the tubular body 22. The cable tangs 36a, 36b, 36c have angled tips as shown for tips 38a and 38c, which are shown in cross-section. The cable tangs 36a, 36b, 36c are nearest the trailing end 26 of the connector 70 with their ends 40a, 40b, 40c (40b shown) oriented toward the forward end 24. The second embodiment 70 of the one-piece snap-in electrical connector includes a plurality of securement tangs 30 and grounding tangs 32 similar to those of the preferred embodiment of the invention.

The second embodiment is different from the preferred embodiment by the mechanism which stops forward travel of the connector into a junction box, which for the second embodiment is a central flange 72 around the periphery of the tubular body 22. When inserted into a junction box, the securement tangs 30 are first contacted by the inside periphery of a knock-out, are depressed inwardly, and spring out again when clear of the junction box wall. The grounding tangs are depressed and remain depressed against the inner periphery of the knock-out to maintain a ground between the junction box and the connector. Forward travel of the second embodiment of the one-piece snap-in electrical connector is stopped when the wall of the junction box (not shown) contacts the forward face 74 of the central flange 72. The distance between the ends 31 of the securement tangs 30 and the forward face 74 of the central flange 72 define a seat 76 within which the inner periphery of the knock-out (not shown) will rest after the securement tangs 30 clear the junction box wall.

FIG. 10 is a perspective view of the second embodiment 70 of the one-piece snap-in electrical connector in alignment with a knock-out 46 in the wall 45 of a junction box 44. The connector 70 will be aligned with and advanced along an axis 78 centered on a knock-out 46 within the junction box 44. The connector 70 will be inserted within the knock-out 46 until the securement tangs 30 clear the junction box wall 45.

Although there has been shown and described an example of what is at present considered the preferred embodiment of a one-piece snap-in electrical connector, it will be obvious to those skilled in the art that various changes and modifications may be made therein without departing from the scope of the invention as defined by the appended claims.

What is claimed is:

1. A one-piece snap-in electrical connector made from spring metal for connecting electrical cables having grooves to junction boxes comprising:

a tubular body including a forward end and a trailing end;

a plurality of integral securement tangs having ends projecting outwardly from said forward end of said tubular body with said ends of said securement tangs oriented toward said trailing end;

an integral stop member with an end projecting outwardly from said tubular body with said end of said stop member oriented toward said forward end;

a plurality of integral grounding tangs projecting outwardly from said tubular body and located longitudinally along said tubular body between said securement tangs and said stop member; and a plurality of integral cable tangs between said integral stop member and said trailing end with said integral cable tangs having ends projecting inwardly from said trailing end of said tubular body with said ends of said cable tangs oriented toward said forward end.

2. The one-piece snap-in electrical connector of claim 1 wherein said cable tangs include an angled end which aids in gripping one of said grooves of one of said cables, said angled end being at approximately a 90° angle to a central axis of said tubular body.

3. The one-piece snap-in electrical connector of claim 1 wherein said ends of said securement tangs are separated from said end of said stop member by a distance equal to or greater than the wall thickness of a junction box that the connector is to be used in conjunction with.

4. The one-piece snap-in electrical connector of claim 1 wherein said integral cable tangs are positioned in essentially one-half of said tubular body with said cable tangs approximately 90° apart.

5. The one-piece snap-in electrical connector of claim 4 wherein said ends of said integral cable tangs are cut at different angles to form a pyramid shaped channel to enable an inserted cable to nest within said tubular body.

6. The one-piece snap-in electrical connector of claim 1 wherein said ends of said integral cable tangs are spaced at different distances from said trailing end of said tubular body to enable each of said ends to anchor in a groove of a helically-wound cable.

7. The one-piece snap-in electrical connector of claim 1 wherein said tubular body is formed of 0.036" spring steel.

8. The one-piece snap-in electrical connector of claim 1 wherein said tubular body is a cylinder, a split cylinder having a longitudinal welded seam, or a split ring having straight edge or dove-tailed edges.

9. The one-piece snap-in electrical connector of claim 1 wherein said integral stop member is in the form of a plurality of tangs.

10. The one-piece snap-in electrical connector of claim 1 where said connector is made from a single piece of spring metal sheet.

11. A one-piece snap-in electrical connector for connecting electrical cables to junction boxes comprising:

a tubular body including a forward end and a trailing end;

a plurality of integral securement tangs projecting outwardly from said forward end of said tubular body with the ends of said securement tangs oriented toward said trailing end;

a central flange projecting outwardly from said tubular body;

a plurality of integral grounding tangs projecting outwardly from said tubular body and located longitudinally along said tubular body between said securement tangs and said central flange; and a plurality of integral cable tangs located between said central flange and said trailing end of said tubular body and projecting inwardly from said trailing end of said tubular body with the ends of said cable tangs oriented toward said forward end.

* * * * *